United States Patent [19]

Lawson, Jr.

[11] Patent Number: 4,751,872
[45] Date of Patent: Jun. 21, 1988

[54] VENTILATION SYSTEM

[76] Inventor: Theodore J. Lawson, Jr., P.O. Box 33848, San Antonio, Tex. 78233

[21] Appl. No.: 54,195

[22] Filed: May 26, 1987

[51] Int. Cl.$^4$ .............................................. H05K 7/20
[52] U.S. Cl. ........................................... 98/1; 361/384
[58] Field of Search ........................... 98/1; 174/16 R; 361/379, 384; 165/122

[56] References Cited

U.S. PATENT DOCUMENTS

| | | | |
|---|---|---|---|
| 3,586,915 | 6/1971 | Urguhart | 361/384 |
| 3,971,877 | 7/1976 | Lee | 174/16 R |
| 4,106,076 | 8/1978 | Miller et al. | 361/379 X |
| 4,122,508 | 10/1978 | Rumsaugh | 361/384 |
| 4,356,531 | 10/1982 | Marino et al. | 361/384 |
| 4,383,286 | 5/1983 | Hicks | 361/384 |
| 4,672,509 | 6/1987 | Speran | 361/384 |
| 4,685,303 | 8/1987 | Branc et al. | 361/384 X |

OTHER PUBLICATIONS

P. W. Hardin, "Integral Edge Connector", *IBM Technical Disclosure Bulletin*, vol. 20, No. 11A, Apr. 1978.

*Primary Examiner*—Harold Joyce
*Attorney, Agent, or Firm*—Gunn, Lee & Jackson

[57] ABSTRACT

A ventilation system for cooling the accessory board area of a personal computer is disclosed. The system incorporates two thin fans capable of producing an airflow of 25 cubic feet per minute. The entire system is small enough to mount between the chassis of the computer and the outer cover, thereby avoiding disfigurement of the external appearance of the machine. A lower plenum attached to the housing of the system helps direct air toward the lower portion of the accessory boards. The fans are powered by a direct current voltage, and a grounding clip on the unit automatically attaches to the chassis, requiring only one connection to the disk drive connector. An electroluminescent lamp is employed to indicate operation of the system.

1 Claim, 3 Drawing Sheets

VENTILATION SYSTEM

BACKGROUND OF THE INVENTION

1. Field of the Invention

The present invention generally relates to ventilation fans, and more particularly to a ventilation system designed for use on personal computers.

2. Description of the Prior Art

Every computer user understands the importance of alleviating excess heat buildup within the processing unit. Ventilation prolongs the life of critical computer components and reduces the chances of intermittent data errors.

Nearly every computer purchased today has a built in ventilation system. Unfortunately, most systems are designed to carry excess heat away from the power supply exclusively, and any cooling of circuit boards is incidental. Ideally, air temperature within the chassis of most computers should be kept in the range of 84 to 88 F. Temperatures above this range subject the components to a much higher risk of degradation and outright failure due to overheating.

Extreme temperatures may result from many different causes. For example, ambient temperature outside of the computer is very important. No ventilation system can provide adequate cooling if room temperature exceeds 85 F. Additionally, positioning of the computer in a small enclosed area prevents proper movement and/or circulation of air, which may affect heat dissipation. Articles within the computer may inhibit air flow, such as the disk controller ribbon cable. Similarly, extra boards in the card area hinder essential air flow. Alternatively, the exhaust port for the power supply fan, or the air intake grille area, may itself be obstructed.

The present invention is directed to a ventilation system for use on home and office computers, referred to as personal computers, or so-called "PC's," and was specifically designed to be easily adapted to the PC's manufactured by International Business Machines Corporation, hereinafter referred to as IBM (IBM is a registered trademark of International Business Machines Corp.) and other PC's manufactured with similar cover/chassis designs. Ventilation systems have been engineered for the IBM PC in the past, but these systems suffer several disadvantages. First of all, they are fairly bulky and most are mounted on the outside of the machine, reducing its attractiveness and increasing its size. An example of one such ventilation device is the unit manufactured by ABC Computer Peripherals, Inc. of New York, N.Y., under the brand name PC Airflow. Some systems are designed to be mounted between the outer enclosure and the chassis of the unit, requiring the use of extension bolts and/or skirts to insure that the enclosure completely surrounds the chassis. The "PCool" model manufactured by Analytic Information Processing, Inc. (AIP) of Danville, California, falls in this category. Even though the PC chassis and cover are far from being an air tight enclosure, it is nevertheless advantageous to control airflow entry and exit to every extent possible. Finally, special tools are usually needed to mount these devices, and some require permanent connections to the PC. It would, therefore, be desirable and advantageous to devise a ventilation system capable of providing increased air circulation to the card area of the PC, which is easily mounted thereto and does not detract from the appearance of the computer.

SUMMARY OF THE INVENTION

Accordingly, the primary object of the present invention is to provide a ventilation system to be used with home and office computers, particularly the IBM PC and PC/XT, in order to minimize heat-related operating anomalies.

Another object of the invention is to provide such a ventilation system which does not alter the external appearance of the PC.

Still another object of the invention is to provide a ventilation system having improved cooling abilities over prior art PC ventilation systems.

Yet another object of the invention is to provide such a system which may be quickly installed with no special tools, and requiring no special knowledge on the part of the user.

The foregoing objects are achieved in a ventilation system comprising two thin fans mounted within a housing attachable to the front portion of the chassis of the PC. The housing snaps onto the chassis, and has a lower plenum to provide for an airflow path near the bottom portion of the cards. The fans employ a direct current source which, with the use of an automatic grounding tab, requires only one electrical connection to the computer's power supply. An electroluminescent lamp provides a further advantage of indicating when the power to the ventilation system, as well as the processor, is turned on.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of illustrative embodiments when read in conjunction with the accompanying drawings, wherein:

DESCRIPTION OF THE PREFERRED EMBODIMENTS

Figure 1:
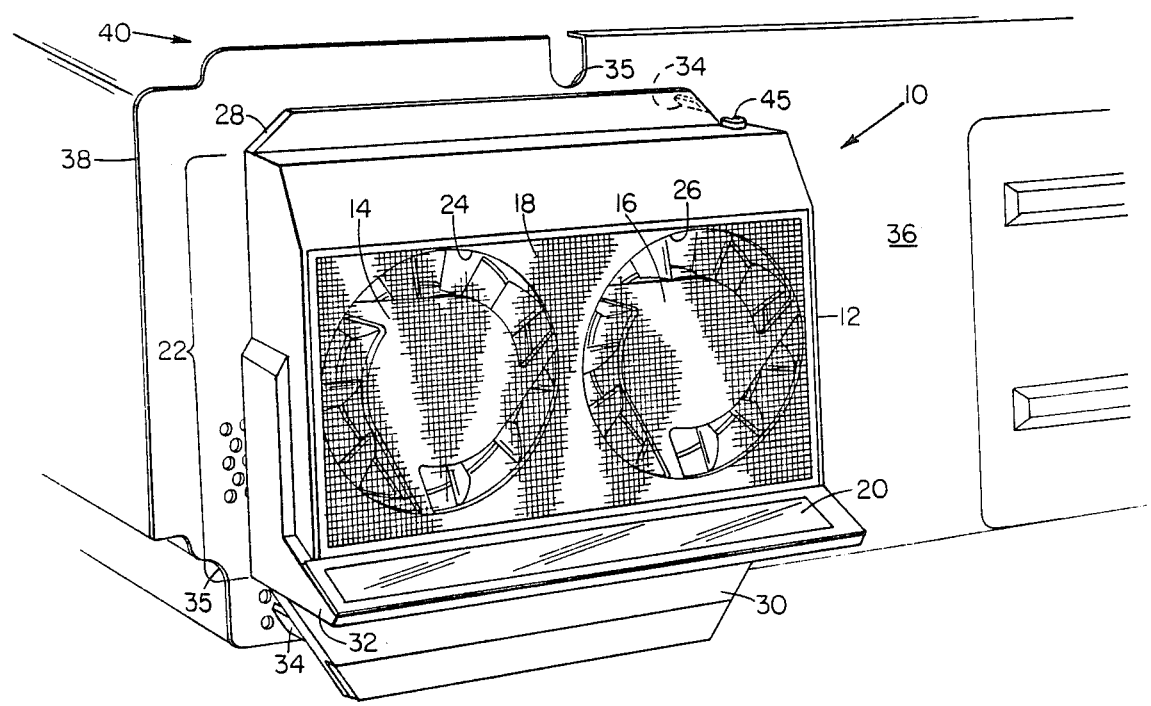
FIG. 1 is a front perspective view of the ventilation system of the present invention, shown adjacent to the front panel of the PC chassis.

With reference now to the figures, and in particular with reference to FIG. 1, there is depicted the ventilation system 10 of the present invention. Ventilation system 10 is generally comprised of a housing 12, two small fans 14 and 16, a screen or filter 18, and an electroluminescent lamp 20.

Housing 12 includes a main body 22 having two circular holes 24 and 26 therein, corresponding to fans 14 and 16, respectively. The upper portion of housing 12 consists of a flange 28 attached to and integral with main body 22, while the lower portion of housing 12 forms a skirt or plenum 30. Another flange or baffle 32 extends from just below main body 22, which enhances air flow into holes 24 and 26, and also provides a support for electroluminescent lamp 20. Housing 12 may be constructed of any lightweight durable material such as hard plastic.

Figure 2:
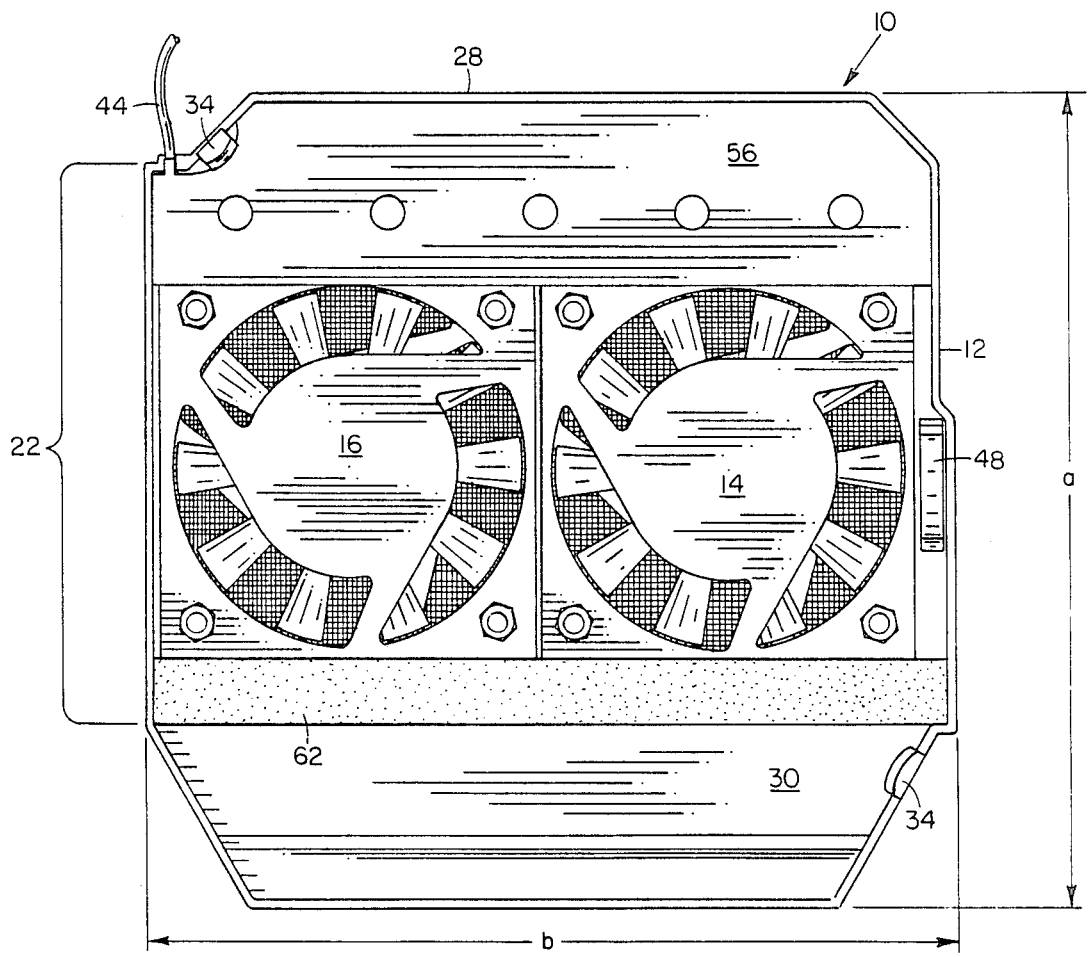
FIG. 2 is a rear elevational view of the ventilation system.

With further reference to FIG. 2, it can be seen that housing 12 has two tabs 34 which are used to mount ventilation system 10 onto the front panel 36 of chassis 38 of computer 40. The dimensions of housing 12 will generally conform to the measurements of front panel 36; for use with IBM PC's, the height a of housing 12 is approximately 5.22 inches, while the length b is approximately 5.30 inches. The straight distance between tabs 34 is approximately 5.97 inches, which corresponds to the distance between two cutouts 35 conveniently placed on the front panel 36 of the IBM PC (the term "IBM PC" is hereby defined to include both the basic IBM PC model and the IBM PC/XT model). Main body 22 of housing 12 has an approximate thickness of 0.85".

Fans 14 and 16 are essentially identical and are mounted side by side in parallel within housing 12 by means of adhesive, or an adhesive strip. The inventor has found that the fans manufactured by Micronel U.S. of Vista, Calif., under the brand name "Ultra-Slim Fan F62AB" are satisfactory for the purposes herein described. That model fan has a square housing whose length is approximately 2.4 inches, and is approximately 0.55 inches thick. It is powered by a direct current source of electricity, unlike all prior art computer ventilation fans, and may operate on five, twelve, or twenty-four volts. The flow rate is about one cubic foot per minute per volt. Using a standard disk drive voltage of twelve volts, the two combined fans have been found to provide a total flow rate of about twenty-five CFM. The two fans should be appropriately chosen to insure that their speeds (rpm) are within 2% of one another so as to avoid resonant vibrations between the two.

Figure 3:
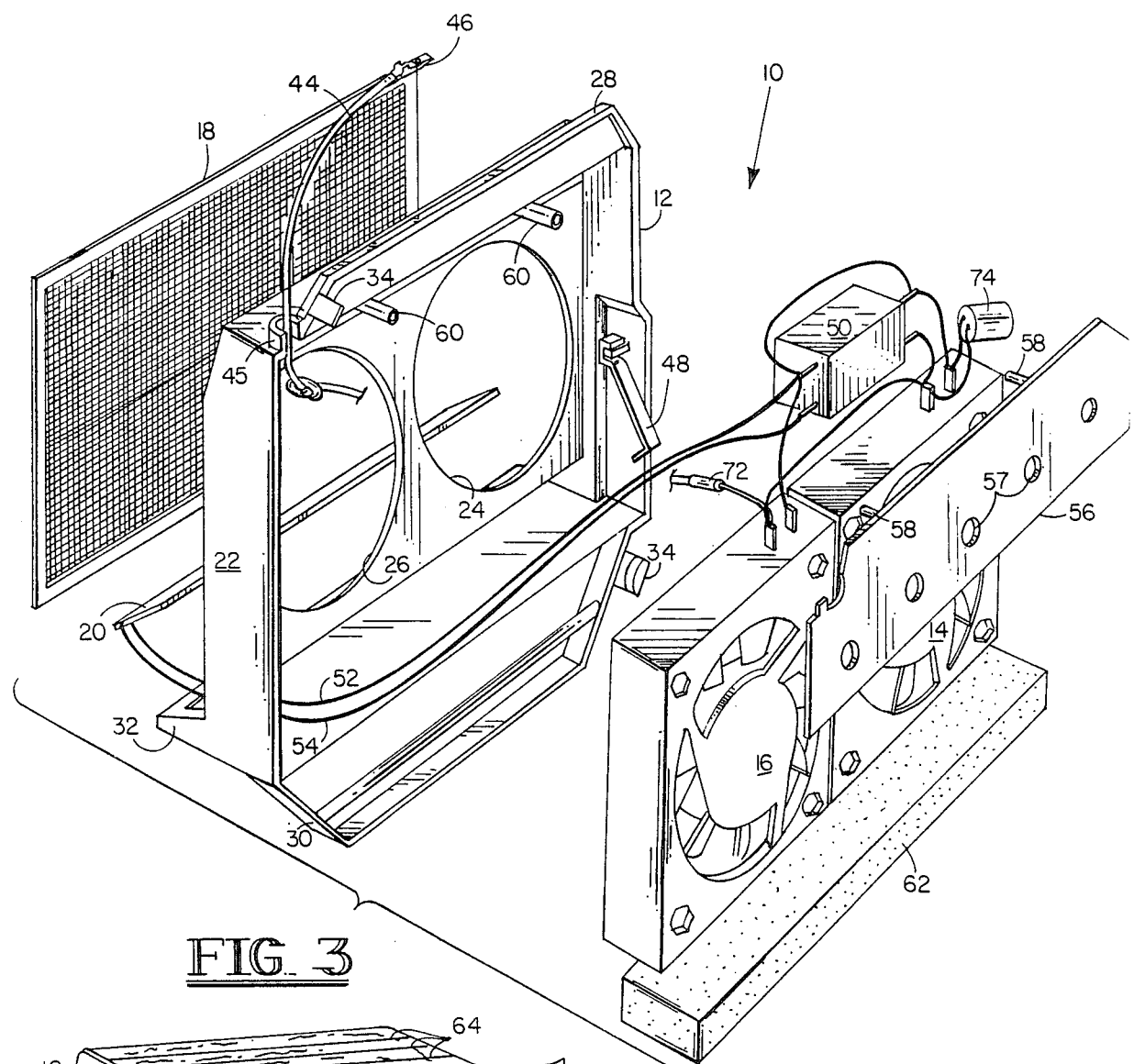
FIG. 3 is an exploded perspective of the system.

Additional features of ventilation system 10 are seen in FIGS. 3. A wire 44 is connected to the positive terminals of each of the fans 14 and 16. A notch 45 in the top of housing 12 provides an exit for wire 44. Wire 44 terminates in an insertion pin 46 which may easily be attached to a source of direct current within chassis 38 of computer 40. Pin 46 is a standard reverse alligator-clip style pin. In IBM PC models, pin 46 should be inserted into the left most hole of the disk drive connector (not shown). The fans are grounded to the chassis 38 by means of a grounding clip 48. Clip 48 is constructed of an electrically conductive metal, and extends slightly beyond the periphery of housing 12, whereby the ventilation system 10 is automatically grounded when mounted on front panel 36 using tabs 34.

Power wire 44 and grounding clip 48 are also connected to an inverter 50 which supplies 90 volt AC power to lamp 20 via wires 52 and 54. Lamp 20 is of a standard electroluminescent type, and is mounted to baffle 32 using a suitable adhesive. An appropriate electroluminescent lamp may be purchased from Luminescent Systems, Inc., of Lebanon, N.H.. The electrical components are held within housing 12 by a protective plate 56, having two dowels 58 which mate with anchors 60, which are further attached and integral with housing 12. Holes 57 in plate 56 serve to accommodate prongs extending from board guide clips that are attached to the chassis to hold accessory boards in place which may be used with computer 40. A more detailed description of the electrical system is described below in conjunction with FIG. 7.

Filter 18 is also attached to housing 12 using an adhesive. Filter 18 should be sufficient to keep out excess dust and debris while still allowing airflow that exceeds 25 cubic feet per minute. The inventors have found that a filter produced by Electro-Maze, Inc. of Carmichael, Calif., is sufficient for this purpose.

In the preferred embodiment, a rectangular strip of foam 62 is placed adjacent to and underneath fans 14 and 16. Foam strip 62 prevents air from flowing back out the front of system 10 through the access slot (not shown) near baffle 32, necessary for wires 52 and 54 to reach electroluminescent lamp 20. Foam strip 62 also conceals routing of wires to lamp 20 and helps in reducing the overall noise level of system 10.

Figure 4:
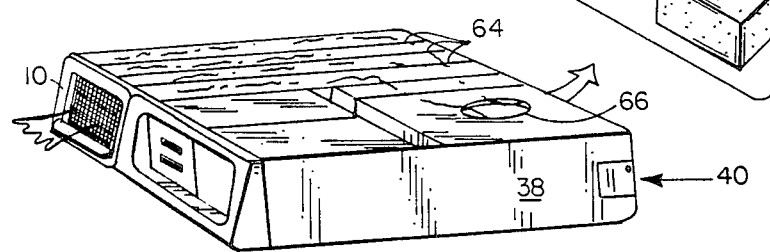
FIG. 4 is a perspective view showing the air flow pattern created by the present invention.

With reference now to FIG. 4, the unique air flow pattern created by ventilation system 10 may be seen. System 10 is shown mounted on a computer 40 whose top cover is removed for purposes of illustration. The system 10 provides a direct air path towards the accessory boards 64 mounted within the left hand portion of chassis 38. Additionally, the system 10 directs air toward the lowermost portion of the interior of chassis 38 where the original, standard components are mounted on the "mother" board. Cooling of the mother board is accomplished by means of the plenum 30 which directs air through the lowest row of ventilation orifices in the front of chassis 38. Air is drawn in through filter 18, passes over and around boards 64 and into power supply fan 66, and finally out the exhaust port (not shown). This increase in air circulation inside the PC cabinet can result in a 27 F. drop in temperature, or more depending on the board configuration and room temperature; it has been found that the surface temperature of a component can drop from 135 F. to 108 F., and the air within chassis 38 can drop from 105 F. to less than 84 F. Of course, a ten degree drop would be significant.

Figure 5:
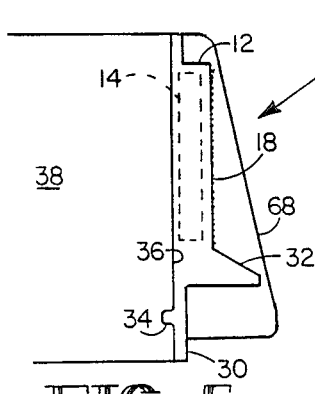
FIG. 5 is a side elevational view showing the ventilation system attached to the PC chassis.
Figure 6:
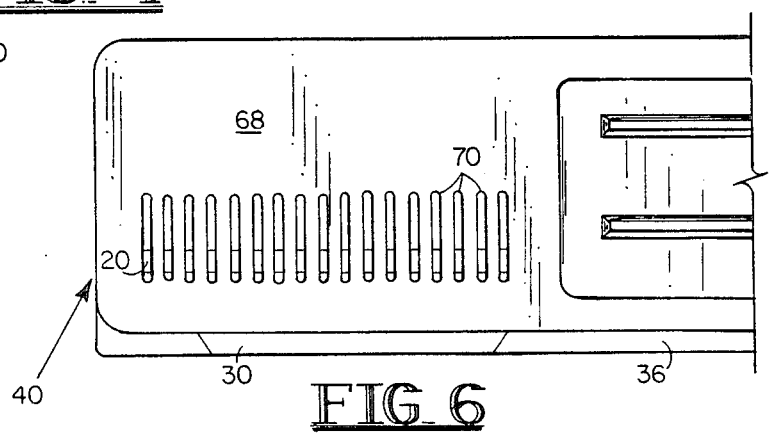
FIG. 6 is a front elevational view of the ventilation system as mounted on the PC and with the enclosure attached.

FIGS. 5 and 6 depict the system as attached to chassis 38 and with cover 68 in place. Only two elements of ventilation system 10 are actually visible to the computer operator when covers 68 is so situated. Plenum 30 extends just below the lowest edge of cover 68 and thereby serves to direct air through the lowest row of orifices in the front panel 36. Electroluminescent lamp 20 is also visible through the series of ventilation slots 70 on the front of cover 68. Actually, lamp 20 will only be noticeable when the power to computer 40, and hence to system 10, is applied.

Figure 7:
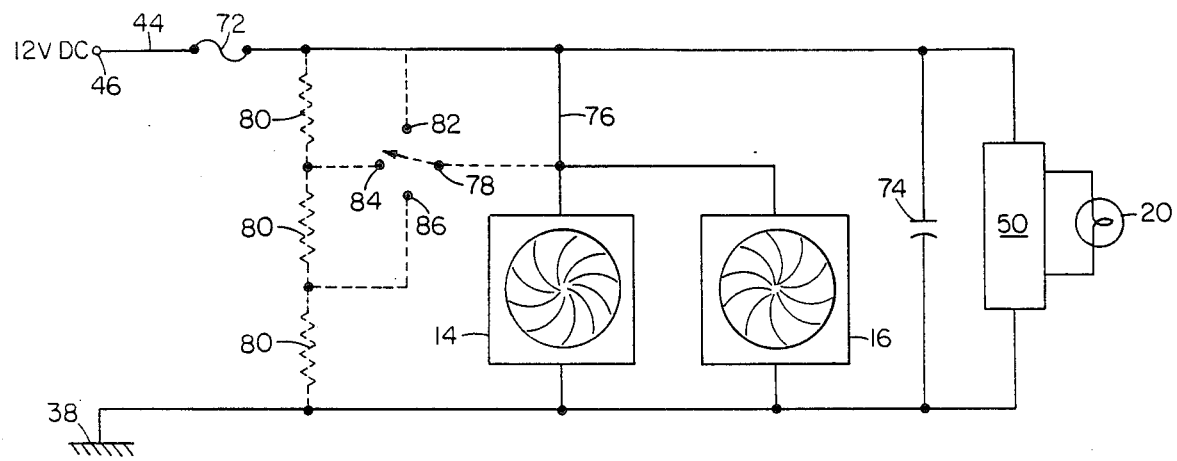
FIG. 7 is a schematic diagram of the electrical system of the present invention.

With further reference to FIG. 7, a detailed schematic of the electrical subsystem of system 10 is shown. Wire 44 leads to a fuse 72 (0.75 amp is preferred), which further connects in parallel to each of the fans 14 and 16, an electrolytic capacitor 74, and inverter 50. Capacitor 74 serves to smooth the current running to fans 14 and 16. Inverter 50 supplies a 90 volt alternating current to electroluminescent lamp 20. The fans, capacitor, and inverter are grounded to chassis 38 via grounding clip 48.

In an alternative embodiment, system 10 is provided with a switch 78 residing within housing 12 which controls the speed of fans 14 and 16. In this embodiment, the direct connection 76 to the fans is removed, and is replaced by switch 78, resistors 80, and poles 82, 84, and 86. Pole 82 corresponds to maximum speed, pole 84 corresponds to medium speed, and pole 86 corresponds to low speed. Resistors 80 should be appropriately chosen to create a ten volt potential at pole 84, and an eight volt potential at pole 86 (pole 82 remains at the twelve volt potential of the disk drive connector line).

INSTALLATION AND OPERATION

The ventilation system 10 of the present invention was designed for simple and quick installation. After disconnecting the power from the PC, the screws securing cover 68 to chassis 38 should be removed, and the cover slid away from the chassis. The ventilation system 10 is then positioned adjacent to the left side of front panel 36, and snapped into place by means of tabs 34. This automatically engages grounding clip 48 with chassis 38. Insertion pin 46 is easily attached to the twelve volt supply of the disk drive. Thus only one non-permanent connection need be made. Cover 68 is then replaced about chassis 38 and secured with screws. System 10 adds less than 0.25" to the effective length of cover 68, thus avoiding the need for disfiguring external attachments.

No tools of any sort are needed to mount housing 12 to chassis 38. The tabs simply clip onto the cutouts in chassis 38. Similarly, the electrical connections are accomplished without the use of a soldering iron or other tool.

Once system 10 is in place, operation is effortless. Turning on the power supply to the PC automatically activates ventilation system 10. The distinctive light emanating from electroluminescent lamp 20 apprises the user that the system is functioning. This becomes an important feature when the PC is used in unattended modem or network operation. In this environment, the monitor or CRT is normally off so that only the illumination of lamp 20 indicates that the processor unit is operating.

Although the invention has been described with reference to specific embodiments, this description is not meant to be construed in a limiting sense. Various modifications of the disclosed embodiment, as well as alternative embodiments of the invention will become apparent to persons skilled in the art upon reference to the description of the invention. It is therefore contemplated that the appended claims will cover such modifications that fall within the true scope of the invention.

I claim:

1. A ventilation system for use on an IBM PC computer, said computer having a chassis and an outer cover, said chassis having a front panel, the leftmost portion of said front panel having an upper array of apertures and a lower row of apertures, and having two cutouts along a periphery of said front panel, said outer cover defining a space between said cover and said front panel, said ventilation system comprising:

a housing having a lower portion, an outer surface, and an inner cavity, and also having two holes therein, said housing being of a size as to fit within said space between said cover and said front panel of said chassis whereby, when said housing is attached to said front panel, said cover surrounds said chassis in the same manner as if said housing were not so attached;

two tabs attached to and integral with said housing for attachment to said cutouts of said front panel of said chassis;

two fans mounted within said cavity, adjacent said two holes, respectively, said fans operable by direct current, and oriented so as to draw air through said holes, into said cavity, and through said upper array and lower row of apertures in said front panel of said chassis, said fans providing an air flow of about one cubic foot per minute per fan per volt;

a grounding clip mounted within said cavity of said housing but extending out therefrom, whereby when said housing is attached to said front panel of said chassis, said grounding clip automatically contacts said chassis, said grounding clip being electrically connected to negative terminals of each of said fans;

a wire having first and second ends, said first end being electrically connected to positive terminals of each of said fans; and a pin connected to said second end of said wire, said pin having a shape suitable for insertion into a disk drive power connector of said computer, said disk drive power connector providing about twelve volts direct current;

a capacitor connected to said wire and said grounding clip in parallel with said fans;

a fuse interposed between said wire and said grounding clip;

an electroluminescent lamp mounted on a baffle, said baffle being attached to and integral with said outer surface of said housing, whereby said lamp is visible to a user of said computer when said system is mounted on said chassis and said cover is in place;

an inverter operably connected to said wire and said grounding clip, for powering said electroluminescent lamp;

a filter attached to said outer surface of said housing, for preventing dust from entering therein, while still allowing said fans to produce airflow of at least twenty-five cubic feet per minute; and a plenum attached to said lower portion of said housing, said plenum directing air through a lower row of said apertures in said front panel of said chassis.

* * * * *